(12) United States Patent
Laven et al.

(10) Patent No.: US 9,923,482 B2
(45) Date of Patent: Mar. 20, 2018

(54) SYSTEM AND METHOD FOR A POWER INVERTER WITH CONTROLLABLE CLAMPS

(71) Applicant: Infineon Technologies AG, Neubiberg (DE)

(72) Inventors: Johannes Georg Laven, Taufkirchen (DE); Heiko Rettinger, Munich (DE); Roman Baburske, Otterfing (DE); Uwe Jansen, Werl (DE); Thomas Basler, Riemerling (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/214,994

(22) Filed: Jul. 20, 2016

(65) Prior Publication Data
US 2018/0026548 A1    Jan. 25, 2018

(51) Int. Cl.
*H02M 3/24* (2006.01)
*H02M 7/44* (2006.01)
(Continued)

(52) U.S. Cl.
CPC .............. *H02M 7/44* (2013.01); *H02M 1/32* (2013.01); *H03K 5/08* (2013.01)

(58) Field of Classification Search
CPC .......... H02M 7/487; H02M 1/32; H02M 7/48; H02M 2007/4811; H02M 7/525;
(Continued)

(56) References Cited

U.S. PATENT DOCUMENTS

| 9,105,679 | B2 | 8/2015 | Laven et al. |
| 2008/0197706 | A1* | 8/2008 | Nielsen ................... H02J 1/102 307/66 |

(Continued)

*Primary Examiner* — Alex Torres-Rivera
(74) *Attorney, Agent, or Firm* — Slater Matsil, LLP

(57) ABSTRACT

A system and method for a power inverter with controllable clamps comprises a first voltage swing path, the first voltage swing path including a first plurality of power transistors, the first voltage swing path producing portions of a positive half-wave of an output signal when active; a second voltage swing path, the second voltage swing path including a second plurality of power transistors, the second voltage swing path producing portions of a negative half-wave of the output signal when active; a first clamping component coupled to the first voltage swing path, the first clamping component forming a freewheeling path for the first voltage swing path, the first clamping component comprising a control terminal, the first clamping component having a first stored charge when the control terminal is in a first state and a second stored charge when the control terminal is in a second state, the first stored charge being greater than the second stored charge; and a second clamping component coupled to the second voltage swing path, the second clamping component forming a freewheeling path for the second voltage swing path, the second clamping component comprising a control terminal, the second clamping component having the first stored charge when the control terminal is in the first state and the second stored charge when the control terminal is in the second state.

26 Claims, 6 Drawing Sheets

(51) Int. Cl.
*H02M 1/32* (2007.01)
*H03K 5/08* (2006.01)
(58) Field of Classification Search
CPC .. H02M 7/527; H02M 7/483; H02M 7/53871; H02M 7/537; H02M 7/44; H03K 5/08
USPC ... 363/55, 56.01, 56.02, 95, 96, 97, 98, 120, 363/121, 131, 132, 135, 136
See application file for complete search history.

(56) References Cited

U.S. PATENT DOCUMENTS

| | | | | |
|---|---|---|---|---|
| 2011/0115532 | A1* | 5/2011 | Roesner | H02M 7/487 327/136 |
| 2012/0218785 | A1* | 8/2012 | Li | H02M 1/34 363/21.12 |
| 2014/0362628 | A1* | 12/2014 | Eckel | H02M 7/483 363/132 |
| 2014/0376287 | A1* | 12/2014 | Narimani | H02M 3/07 363/60 |
| 2015/0263644 | A1* | 9/2015 | Fu | H02M 7/48 363/95 |
| 2015/0349660 | A1* | 12/2015 | White | H02M 7/537 363/131 |
| 2016/0268924 | A1* | 9/2016 | Fu | H02M 7/483 |

* cited by examiner

SYSTEM AND METHOD FOR A POWER INVERTER WITH CONTROLLABLE CLAMPS

TECHNICAL FIELD

The present invention relates generally to power inverters, and, in particular embodiments, to a system and method for a power inverter with controllable clamps.

BACKGROUND

Power inverters convert direct current (DC) power to alternating current (AC) power. The power generated by DC generators, such as solar and wind generators, is converted to AC power with an inverter so that it may be fed (or transmitted) into an electric grid. Three level inverter topologies, sometimes called Neutral Point Clamped (NPC) inverters, have three switching states. NPC inverters have small output voltage steps, which may reduce surge voltages and improve the output AC waveform. NPC inverters are often used in higher voltage applications, such as solar panels and wind turbines. NPC inverters operate with a high pulse-width modulation (PWM) index under normal conditions, and may have a power factor that is close to 1.

Power generators may fail by experiencing a brief voltage drop (e.g., a brownout) or a total failure (e.g., a blackout). During a failure, electricity continues to be fed to the grid. In this condition, called low voltage ride through (LVRT), the inverter continues operating through a low voltage situation. During LVRT, the source voltage and the modulation index for the inverter is small. The power factor for the inverter may also decrease, as the power grid begins exhibiting inductive behaviour. During LVRT, inverters may experience large surge currents that strain the electrical components in the inverters.

SUMMARY

In accordance with a preferred embodiment of the present invention, a device comprises a first voltage swing path, the first voltage swing path including a first plurality of power transistors, the first voltage swing path producing portions of a positive half-wave of an output signal when active; a second voltage swing path, the second voltage swing path including a second plurality of power transistors, the second voltage swing path producing portions of a negative half-wave of the output signal when active; a first clamping component coupled to the first voltage swing path, the first clamping component forming a freewheeling path for the first voltage swing path, the first clamping component comprising a control terminal, the first clamping component having a first stored charge when the control terminal is in a first state and a second stored charge when the control terminal is in a second state, the first stored charge being greater than the second stored charge; and a second clamping component coupled to the second voltage swing path, the second clamping component forming a freewheeling path for the second voltage swing path, the second clamping component comprising a control terminal, the second clamping component having the first stored charge when the control terminal is in the first state and the second stored charge when the control terminal is in the second state.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to various embodiments, controllable diodes are implemented in the various branches of an NPC inverter. The controllable diodes may be switched between a normal operating mode with a lower stored charge, and a surge current operating mode with a higher stored charge. In the normal operating mode, the diodes have lower reverse recovery losses, and in the surge current operating mode, the diodes may withstand higher surge current. In some embodiments, a diode is controlled to discharge any stored charge in the diode before the branch for that diode is switched on. Discharging the diode before switching on a branch of the inverter may reduce the switching losses in that branch of the inverter.

Figure 1:
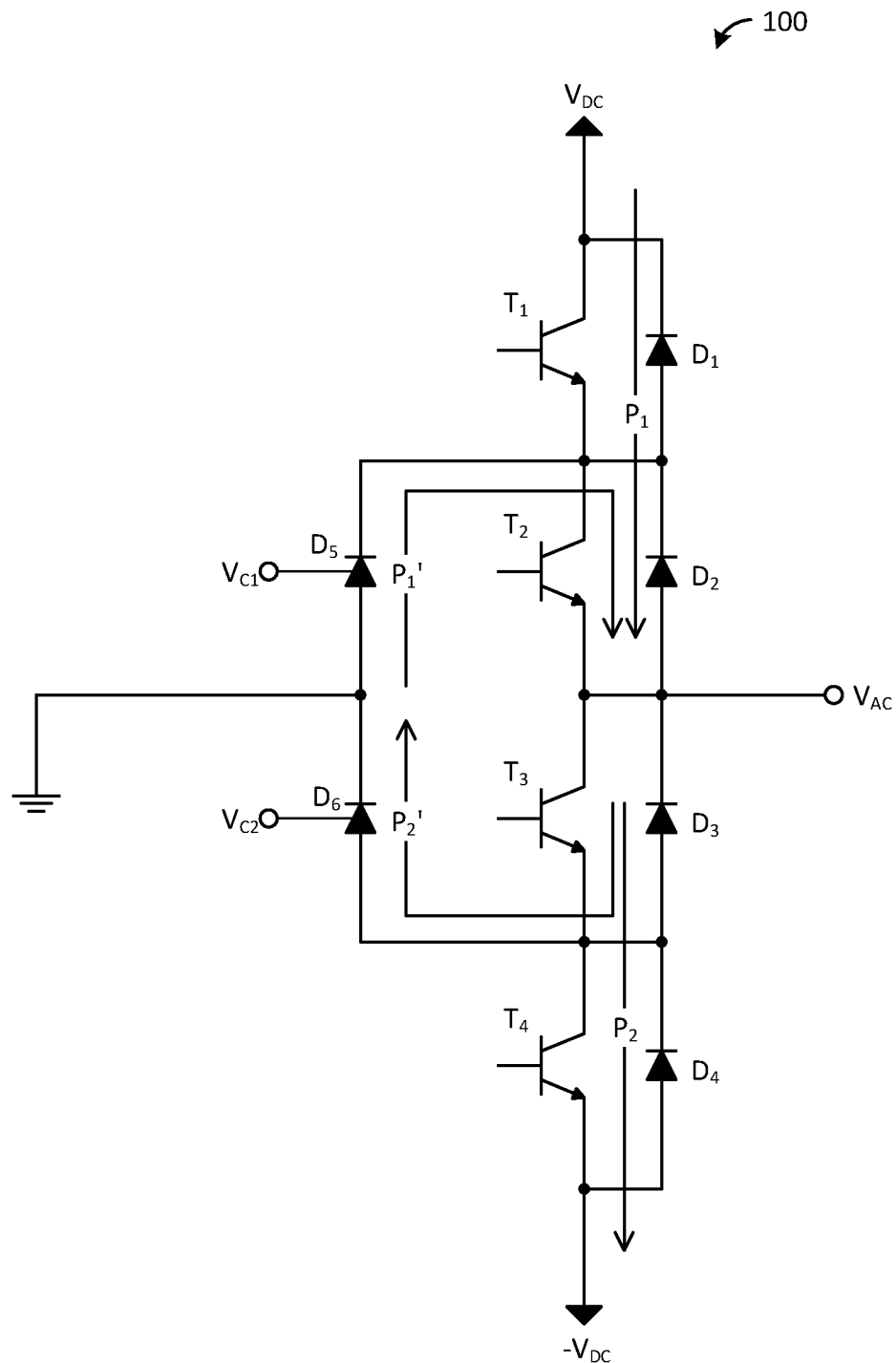
FIG. 1 shows an NPC inverter.

FIG. 1 shows an NPC inverter 100. The NPC inverter 100 includes power transistors $T_1$-$T_4$, freewheeling diodes $D_1$-$D_4$, and clamping diodes $D_5$-$D_6$. DC input signals $V_{DC}$ and $-V_{DC}$ power the NPC inverter 100, which produces an AC output signal $V_{AC}$. The power transistors $T_1$-$T_4$ and their respective freewheeling diodes $D_1$-$D_4$ may be different components of a same device, such as a reverse conducting insulated-gate bipolar transistors (IGBT) with diode control (RCDC IGBT).

During normal operation, current flowing through the NPC inverter 100 switches according to a first output mode or a second output mode. In the first output mode, the NPC inverter 100 switches between a first path $P_1$ that includes the transistors $T_1$-$T_2$, and a second path $P_1'$ that includes the clamping diode $D_5$ and the transistor $T_2$. In the second output mode, the NPC inverter 100 switches between a first path $P_2$ that includes the transistors $T_3$-$T_4$, and a second path $P_2'$ that includes the clamping diode $D_6$ and the transistor $T_3$. In the first output mode, the NPC inverter 100 produces portions of the positive half-wave of the output signal $V_{AC}$, and in the second output mode, the NPC inverter 100 produces portions of the negative half-wave of the output signal $V_{AC}$. The clamping diodes $D_5$-$D_6$ are forward biased during normal operation, and ordinarily do not undergo a significant load. When switching between the first paths $P_1/P_2$ and the second paths $P_1'/P_2'$, the reverse recovery currents $I_{RR}$ of the clamping diodes $D_5/D_6$ are discharged in the transistors $T_1/T_4$, leading to increased losses generated by those transistors $T_1/T_4$. The losses of the may limit the output of the NPC inverter 100.

During LVRT, current flows according to a third output mode, where current is switched between a first path that includes transistor $T_2$ and clamping diode $D_5$, and a second path that includes transistor $T_3$ and clamping diode $D_6$. One or both of the clamping diodes $D_5$-$D_6$ may be reverse biased during LVRT, and undergo a significant load. The power factor and modulation index of the NPC inverter 100 may also decrease during LVRT, e.g., while the clamping diodes $D_5$-$D_6$ experience a current surge. The temperature of the clamping diodes $D_5$-$D_6$ increases with the increased load, which can destroy the clamping diodes $D_5$-$D_6$ or wear them out over time. Increasing the size of the clamping diodes $D_5$-$D_6$ increases the amount of charge they can store, increasing the surges they can sustain. Decreasing the size of the clamping diodes $D_5$-$D_6$ may lower the space requirements, which may be strict in some systems. Further, increasing the amount of charge a clamping diode can store may increase the switching losses of the transistors $T_1/T_4$ during normal operation. Optimizing the NPC inverter 100 may thus present a tension between reducing switching losses (which may call for smaller clamping diodes), and increasing surge capability (which may call for larger clamping diodes).

In an embodiment, the clamping diodes $D_5$-$D_6$ are implemented as programmable diodes that are capable of operating in several selectable states, such as MOS gate-controlled diodes. The clamping diodes $D_5$-$D_6$ have an anode and a cathode, and also have a third (control) terminal that is similar to the gate of a transistor. The third terminal switches the clamping diodes $D_5$-$D_6$ between a normal operating mode and a surge current mode. In normal operating mode, the clamping diodes $D_5$-$D_6$ have a lower stored charge, which reduces the reverse recovery losses of the diodes and may decrease power losses in the transistors $T_1$-$T_4$. In surge current operating mode, the clamping diodes $D_5$-$D_6$ have lower conduction losses, which increases the current load the clamping diodes $D_5$-$D_6$ may sustain. Additionally, in surge current operating mode, the clamping diodes $D_5$-$D_6$ have a higher stored charge, increasing their reverse recovery losses. The third terminals are controlled by control signals $V_{C1}$-$V_{C2}$. Using controllable clamping diodes may reduce the size and increase the efficiency of the NPC inverter 100. The clamping diodes $D_5$-$D_6$ may be diodes that are similar to diodes disclosed in U.S. Pat. No. 9,105,679, which is incorporated by reference herein as if reproduced in its entirety. For example, the clamping diodes $D_5$-$D_6$ may include a barrier region sandwiched between a drift region and a charge carrier transfer region. A control structure in the diodes may be configured to form an inversion layer in the drift (n-type) or the barrier (p-type) regions in an inversion state and to form no inversion layer in the drift and barrier regions in a non-inversion state. The diodes may have higher stored charge when the inversion layer is formed in the drift region.

In some embodiments, the clamping diodes $D_5$-$D_6$ are diodes with controllable anode efficiency. The anode efficiency of the diodes may be varied homogenously over the diodes in a lateral direction between the anode and the cathode. In such embodiments, the diodes may include a buried n-doped layer throughout the diode. In some embodiments, the diodes may include a mix of controllable MOS gated diodes (MGD) and ordinary diodes.

In some embodiments, the clamping diodes $D_5$-$D_6$ have at least two operating modes. In the first operating mode, the diodes are active and behave as ordinary diodes during forward operation. In the second operating mode, the diodes have a controllable active semiconductor area, which can be increased to provide a larger area for carrying surge currents. Controlling the signal supplied to the control terminal of the diodes may control the active semiconductor area. The diodes may cause lower losses in an NPC when the active semiconductor area is smaller. In some embodiments, the diodes may include a first semiconductor area and a second semiconductor area. Enabling both areas may increase the active semiconductor area of the diodes. Disabling one or both of the semiconductor areas may decrease the active semiconductor area. In some embodiments, the size of the second area may be a multiple of the size of the first area. For example, the second area may be about 30%, 50%, 100%, or 200% of the first area.

Varying the active semiconductor area may include varying the anode efficiency of the diodes. In the second operating mode, the diodes may have be configured to have a higher effective anode efficiency. In the first operating mode, the diodes may have a lower effective anode efficiency than the second operating mode. In some embodiments, the diodes may have a third operating mode, wherein the diodes have a lower effective anode efficiency than the first operating mode. When operating in the third operating mode, the diodes may quickly discharge.

Figure 2:
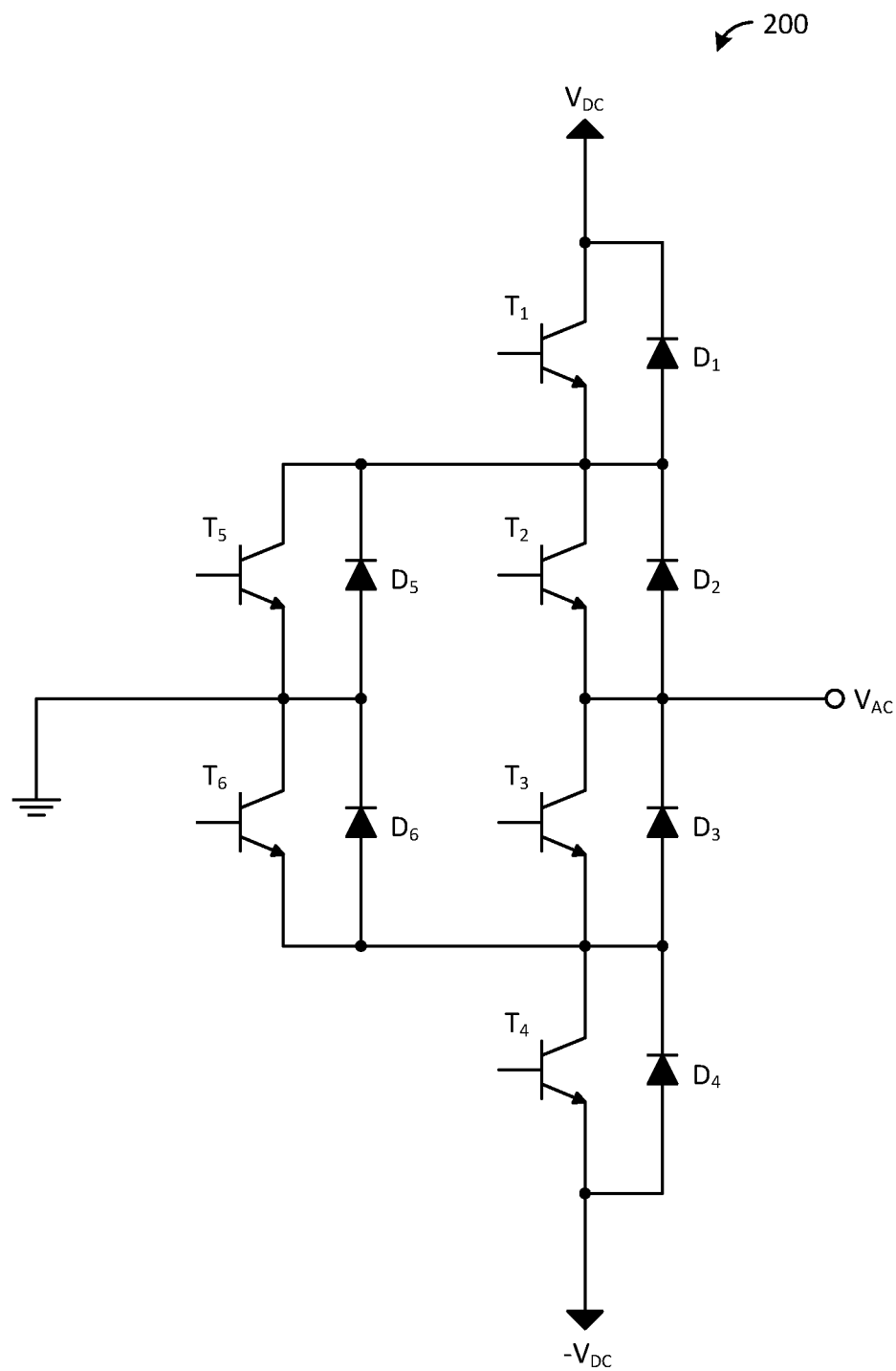
FIG. 2 shows an active-NPC inverter.

FIG. 2 shows an active-NPC (ANPC) inverter 200. The ANPC inverter 200 is similar to the NPC inverter 100, except that the ANPC inverter 200 includes transistors $T_5$-$T_6$ with the clamping diodes $D_5$-$D_6$. In some embodiments, the clamping diodes $D_5$-$D_6$ may be controllable diodes. In some embodiments, transistor $T_5$ and clamping diode $D_5$ may be a first RCDC IGBT, and the transistor $T_6$ and clamping diode $D_6$ may be a second RCDC IGBT. The first and the second RCDC IGBT may offer some diode control capabilities so that the clamping diodes $D_5$-$D_6$ in the ANPC inverter 200 may switch between a normal operating mode and a surge current mode.

Figure 3:
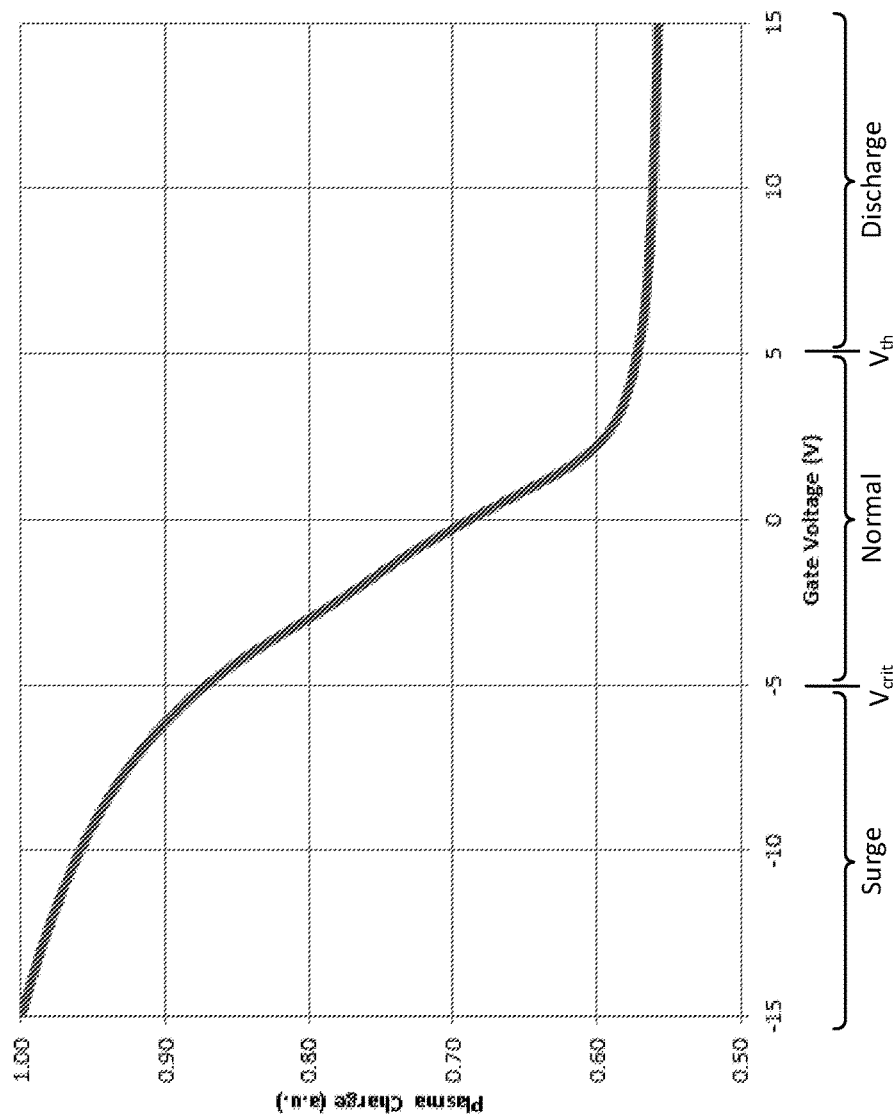
FIG. 3 is a graph showing stored plasma charge in controllable diodes.

FIG. 3 is a graph showing the stored plasma charge in the clamping diodes $D_5$-$D_6$ as a function of the gate voltage. The graph in FIG. 3 shows that the clamping diodes have three distinct operating regions.

The first operating region includes voltages below a critical control terminal voltage ($V_{crit}$). As shown, the clamping diodes have a higher stored charge when operating in the first region. As a result, the clamping diodes have high surge current capabilities when operating in the first region, and so the first region may be referred to as the surge current mode. In some embodiments, the critical control terminal voltage $V_{crit}$ is between about −3 volts and about −7 volts, such as about −5 volts.

The second operating region includes voltages above the critical control terminal voltage $V_{crit}$ but below a threshold control terminal voltage ($V_{TH}$). As shown, the clamping diodes have a lower stored charge when operating in the second region. As a result, the clamping diodes have low reverse recovery losses when operating in the second region, and so the second region may be referred to as the normal operating mode. In some embodiments, the threshold control terminal voltage $V_{TH}$ is between about 5 volts and about 6 volts, such as about 5 volts. In some embodiments, the threshold control terminal voltage $V_{TH}$ may be any value greater than the critical control terminal voltage $V_{crit}$, such as 0 volts, 2 volts, 5 volts, and the like.

The third operating region includes voltages above the threshold control terminal voltage ($V_{TH}$). As shown, the clamping diodes have a lower stored charge when operating in the third region. When the control terminal voltage exceeds the threshold control terminal voltage $V_{TH}$, charge carriers in the clamping diode are removed. As a result, the stored charge in the diodes rapidly decreases, which decreases switching losses of transistors in an NPC inverter the diode is part of. As a result, the third region may be referred to as the discharge mode. In some embodiments, the diode may not exhibit reverse blocking properties in the third operation region.

Figure 4:
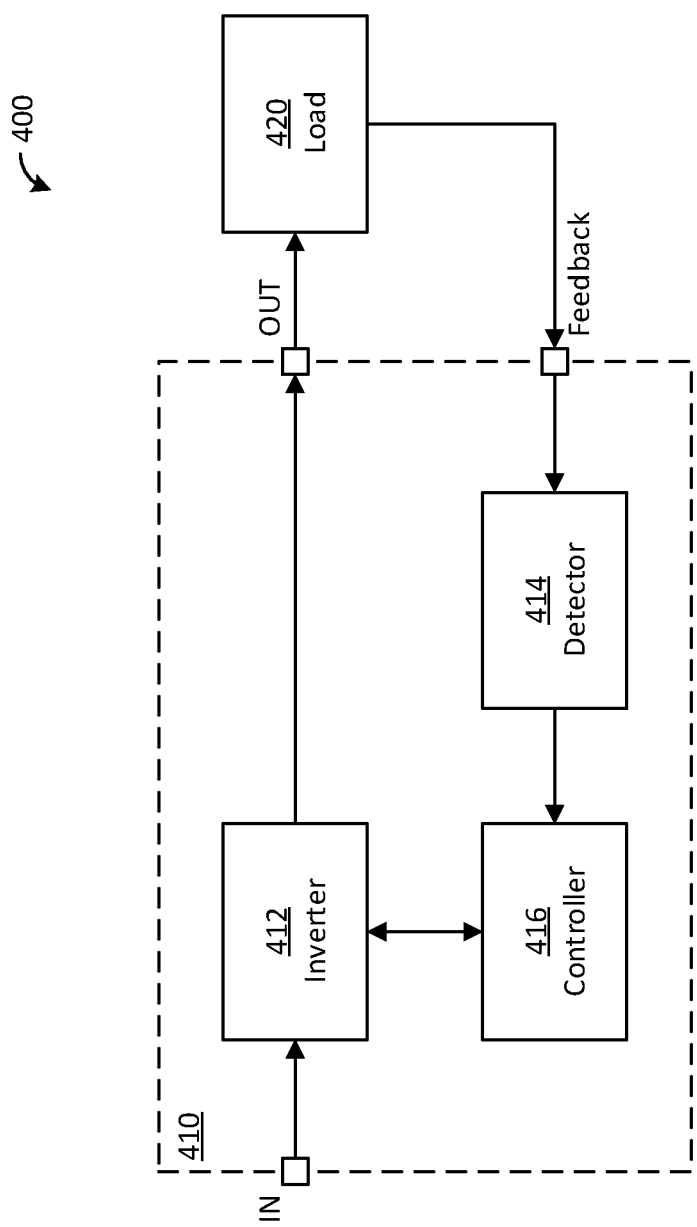
FIG. 4 is a block diagram of a power system.

FIG. 4 is a block diagram of a power system 400, which has an inverter system 410 powering a load 420. The inverter system 410 receives an input DC signal from a power generator, such as a solar panel or wind turbine, and converts it to an output AC signal. The output AC signal is supplied to the load 420. The inverter system 410 includes an inverter, according to various embodiments, and control devices to protect the inverter during LVRT.

The inverter system 410 includes an inverter 412, a detector 414, and a controller 416. The inverter system 410 controls the operating mode of clamping diodes in the inverter 412 to protect the system during LVRT. The inverter system 410 has an input, an output, and feedback for detecting the output of the inverter system 410.

The inverter 412 may be similar to the NPC inverter 100 or the ANPC inverter 200, and uses controllable diodes or RCDC IGBTs for clamping each branch of the NPC. During LVRT, the clamping diodes or IGBTs operate in the first mode where they have a higher stored charge. Having a higher stored charge increases the surge current capability but also the reverse recovery loss. During normal operation, the clamping diodes or IGBTs operate in the second mode, where they have a lower stored charge. Having a lower stored charge reduces the reverse recovery loss but also the surge current capability.

The detector 414 measures the output of the inverter system 410. In the illustrated embodiment, the detector 414 directly measures the load 420 to measure the output, but other feedback mechanisms could be used. For example, the detector 416 could indirectly measure or approximate the output by measuring the power factor or the modulation index of the inverter 412.

The controller 416 is coupled to the inverter 412 and the detector 414. The controller 416 controls the inverter 412 to produce an AC signal by switching the inverter 412 between appropriate output modes for each half-wave of the output signal $V_{AC}$. The controller 416 may be a microcontroller, microprocessor, DSP, digital logic device, or the like. In some embodiments, the controller 416 may produce the AC signal with sine wave modulation, wherein the inverter 412 is switched between output modes at a higher rate than the output signal. For example, the inverter 412 may be switched at a sampling rate that is a multiple of the frequency of the AC signal. In some embodiments, the multiple may be between about 50 and about 400, such as about 100. In some embodiments, the inverter 412 may switch at a frequency of between about 500 Hz and about 20 kHz to produce an AC signal with a frequency of between about 1 Hz and 50 Hz, respectively.

During operation, the controller 416 determines the output of the inverter system 410 using the detector 414. By detecting a decreased output, the controller 416 can determined whether the inverter 412 has entered or is about to enter LVRT and a surge state. For example, when the output voltage measured by the detector 414 falls below a predetermined threshold, the controller 416 can detect a surge. During normal operation, the controller 416 sets the clamping diodes in the inverter 412 to the second mode. When the controller 416 determines a surge state, the controller 416 switches the clamping diodes in the inverter 412 to the first mode. The controller 416 changes the mode of clamping diodes by changing the gate voltage of the controllable diodes of the inverter 412.

The load 420 is powered by the output AC signal, and may be indicative of a larger electrical distribution grid. During LVRT, the inverter system 410 continues powering the load 420 to avoid disturbing the electrical grid. During LVRT, the load 420 may begin to exhibit inductive behaviour from the perspective of the inverter system 410, causing thermal stress in the clamping diodes $D_5$-$D_6$ of the inverter 412.

In some embodiments, the controller 416 briefly switches a clamping diodes in the inverter 412 to the third mode before enabling transistors in the output path of the clamping diode. In the third mode, the controllable diodes or RCDC IGBTs discharge their stored charge before the transistors in the output path are turned on. Discharging the stored charge before turning the transistors on avoids discharging the stored charge through the transistors. This may decrease the switching losses of the transistors, further reducing losses in the inverter 412.

Figure 5:
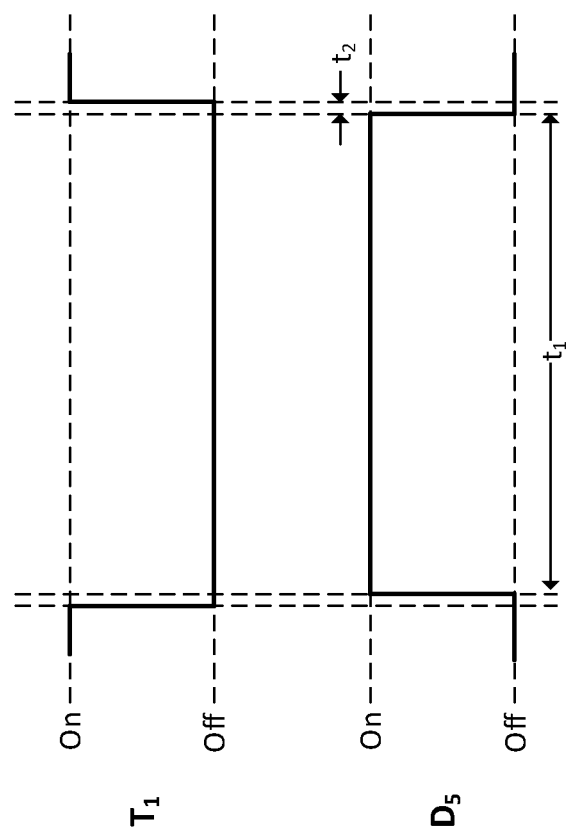
FIG. 5 shows a timing diagram of control lines in an NPC inverter.

FIG. 5 shows a timing diagram of control lines for components in an inverter, such as the NPC inverter 100. The timing diagram is indicative of embodiments where the clamping diode for a branch, such as the clamping diode $D_5$, is discharged before a transistor in the branch, such the transistor $T_1$, is turned on. As shown, the control voltage for the clamping diode $D_5$ is raised briefly for a time $t_1$ before the transistor $T_1$ is turned on. As noted above in FIG. 3, increasing the control voltage reduces the stored charge in the clamping diode $D_5$. For example, when the NPC inverter 100 is operating in the second mode, the clamping diode $D_5$ may be briefly switched to the third mode and then back to the second mode. The time $t_1$ may vary based on the operating condition of the NPC inverter 100. When the clamping diodes $D_5$-$D_6$ are blocking voltages of less than about 2000 V, the time may be between about 1 ms and about 10 ms. When the clamping diodes $D_5$-$D_6$ are blocking voltages of about 6.5 kV, the time may be between about 20 ms and about 100 ms. The clamping diode $D_5$ is switched back to the second mode after discharge because it may not be able to block reverse voltages when in the third mode, e.g., when in a discharging state. As such, the clamping diode $D_5$ may be switched off a lead time $t_2$ before the transistor $T_1$ is turned on. The lead time $t_2$ may be between about 10 ns and about 2 µs.

Figure 6:
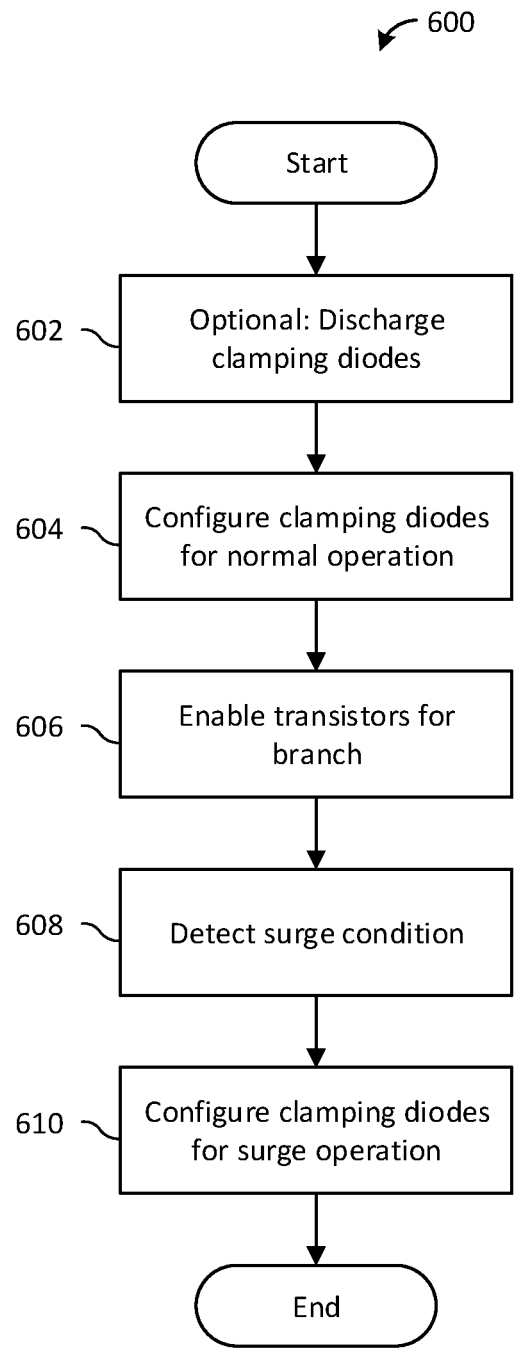
FIG. 6 is a diagram of an inverter protection method.

FIG. 6 is a diagram of an inverter protection method 600. The inverter protection method 600 may be indicative of operations occurring in an inverting system, such as the inverter system 410 above. While it is shown as a sequential flow diagram, it should be appreciated that the inverter protection method 600 may be performed in various orders.

First, the clamping diodes in the inverter are optionally discharged (step 602). The clamping diodes may be discharged by setting their control voltage above a discharge threshold. Discharging the clamping diodes may protect transistors in the inverter or reduce their switching losses. The amount of time that the clamping diodes are set above the discharge threshold may be determined according to the voltage the inverter operates at.

Next, the clamping diodes in the inverter are configured for normal operation (step 604). In normal operation, the clamping diodes have a low stored charge. The diodes may be set to normal operating mode by setting their control voltage above a critical level.

Next, the transistors for a branch of the inverter are turned on (step 606). Either the transistors for the positive half-swing branch, or the transistors for the negative half-swing branch of the inverter may be turned on.

Next, a surge condition is detected in the inverter (step 608). The surge condition may be caused by a voltage drop, e.g., during LVRT. The surge condition may be detected by directly measuring the output voltage of the inverter, or by measuring a property of the inverter such as the power factor or modulation index.

Next, the clamping diodes are set to a surge mode (step 610). The diodes may be set to the surge operating mode by setting their control voltage below the critical level. In surge mode, the clamping diodes have a high stored charge, allowing them to withstand a high current without suffering significant damage or overheating.

An advantage of a preferred embodiment of the present invention is that a clamping diode in an inverter may be protected without significantly increasing its size. Typically, increasing the active semiconductor area of the components increases their surge current capability. Reducing the size of clamping diodes may decrease space requirements and increase electrical performance. This allows reverse recovery losses of the diode to be optimized without increasing the risk of damage to the diode. Power efficiency may thus be improved. Further, discharging the diode before normal operation may protect transistors in the inverter branch with the diode, and may reduce switching losses of the transistors, increasing their power efficiency.

In accordance with a preferred embodiment of the present invention, a device includes: a first voltage swing path, the first voltage swing path including a first plurality of power transistors, the first voltage swing path producing portions of a positive half-wave of an output signal when active; a second voltage swing path, the second voltage swing path including a second plurality of power transistors, the second voltage swing path producing portions of a negative half-wave of the output signal when active; a first clamping component coupled to the first voltage swing path, the first clamping component forming a freewheeling path for the first voltage swing path, the first clamping component including a control terminal, the first clamping component having a first stored charge when the control terminal is in a first state and a second stored charge when the control terminal is in a second state, the first stored charge being greater than the second stored charge; and a second clamping component coupled to the second voltage swing path, the second clamping component forming a freewheeling path for the second voltage swing path, the second clamping component including a control terminal, the second clamping component having the first stored charge when the control terminal is in the first state and the second stored charge when the control terminal is in the second state.

In some embodiments, the first voltage swing path includes a first plurality of power switches coupled to a positive voltage source and a common terminal, the common terminal outputting the output signal; the first clamping component includes an anode and a cathode, the anode of the first clamping component coupled to an input signal, the cathode of the first clamping component coupled to the first plurality of power switches; the second voltage swing path includes a second plurality of power switches coupled to a negative voltage source and the common terminal; and the second clamping component includes an anode and a cathode, the cathode of the second clamping component coupled to the input signal, the anode of the second clamping component coupled to the second plurality of power switches. In some embodiments, the first clamping component and the second clamping component are diodes that have a low anode efficiency when the control terminals are in the first state and have a high anode efficiency when the control terminals are in the second state. In some embodiments, the diodes include a buried n-doped layer throughout the diodes in a lateral direction between the anode and the cathode. In some embodiments, the diodes are MOS gated diodes. In some embodiments, the first clamping component and the second clamping component are reverse conducting insulated-gate bipolar transistors with diode control (RCDC IGBTs). In some embodiments, the first clamping component and the second clamping component have a third stored charge when the control terminals are in a third state, the third stored charge being less than the second stored charge. In some embodiments, the first clamping component and the second clamping component are coupled to a controller, the controller configured to: measure the output signal; and switch the control terminals of the first clamping component and the second clamping component to the first state in response to the output signal falling below a predetermined threshold. In some embodiments, the controller is further configured to switch the control terminals of the first clamping component and the second clamping component to the second state in response to the output signal rising above the predetermined threshold. In some embodiments, the controller is further configured to: switch the control terminal of the first clamping component to the third state; switch the control terminal of the first clamping component to the second state after a time period elapses; and activate the first voltage swing path.

In accordance with a preferred embodiment of the present invention, a system includes: an NPC inverter including a plurality of clamping devices, each of the plurality of clamping devices having a control terminal, each of the plurality of clamping devices having a first stored charge when the control terminal is in a first state and a second stored charge when the control terminal is in a second state, the first stored charge being greater than the second stored charge, the NPC inverter producing an AC output signal from a DC input signal; a detector configured to measure the AC output signal of the NPC inverter; and a controller coupled to the detector and the NPC inverter, the controller configured to switch the control terminal of each of the plurality of clamping devices to the first state when the AC output signal measured by the detector falls below a predetermined threshold.

In some embodiments, the plurality of clamping devices include IGBTs in parallel with controllable diodes, the IGBTs and controllable diodes being in voltage swing paths of the NPC inverter. In some embodiments, the plurality of clamping devices are diodes that have a low anode efficiency in the first state and a high anode efficiency in the second state. In some embodiments, the diodes include a controllable active semiconductor area, and wherein the size of the controllable active semiconductor area in the first state is greater than the size of the controllable active semiconductor area in the second state. In some embodiments, the diodes include buried n-doped layers throughout the diodes in a lateral direction between anodes and cathodes of the diodes. In some embodiments, the diodes are MOS gated diodes. In some embodiments, the plurality of clamping devices are reverse conducting insulated-gate bipolar transistors with diode control (RCDC IGBTs). In some embodiments, the controller is further configured to switch the control terminal of each of the plurality of clamping devices to the second state when the AC output signal measured by the detector rises above a predetermined threshold. In some embodiments, each of the plurality of clamping devices have a third stored charge when the control terminal is in a third state, the third stored charge being less than the second stored charge. In some embodiments, the controller is further configured to: switch the control terminal of a first clamping device of the plurality of clamping devices to the third state; and switch the control terminal of the first clamping device to the second state after a time period elapses; and activate a path of the NPC inverter coupled to an anode and a cathode of the first clamping device. In some embodiments, the path of the NPC inverter is activated between about 100 ns and about 2 µs after the control terminal of the first clamping device is switched to the second state. In some embodiments, the time period is between about 1 ms and about 10 ms, and a blocking voltage of the clamping devices is less than about 2000 V. In some embodiments, the time period is between about 20 ms and about 100 ms, and a blocking voltage of the clamping devices is about 6.5 kV. In some embodiments, the DC input signal is sourced from a solar panel. In some embodiments, the DC input signal is sourced from a wind turbine. In some embodiments, the AC output signal is transmitted to an electricity grid.

In accordance with a preferred embodiment of the present invention, a method includes: configuring a clamping device in an inverter to operate in a first mode, the inverter producing an output signal equal to a first voltage in the first mode; enabling a branch of the inverter coupled to the clamping device; measuring the output signal; and switching the clamping device to operate in a second mode in response to the measured output signal being a second voltage less than the first voltage.

In some embodiments, the method further includes before enabling the branch of the inverter, switching the clamping device to a third mode; waiting a time period; and switching the clamping device to the first mode.

Although this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A device comprising:
   a first voltage swing path, the first voltage swing path including a first plurality of power transistors, the first voltage swing path producing portions of a positive half-wave of an output signal when active;
   a second voltage swing path, the second voltage swing path including a second plurality of power transistors, the second voltage swing path producing portions of a negative half-wave of the output signal when active;
   a first clamping component coupled to the first voltage swing path, the first clamping component forming a freewheeling path for the first voltage swing path, the first clamping component comprising a control terminal, the first clamping component having a first stored charge when the control terminal is in a first state, the first clamping component having a second stored charge when the control terminal is in a second state, the first clamping component having a third stored charge when the control terminal is in a third state, the first stored charge being greater than the second stored charge, the third stored charge being less than the second stored charge; and
   a second clamping component coupled to the second voltage swing path, the second clamping component forming a freewheeling path for the second voltage swing path, the second clamping component comprising a control terminal, the second clamping component having the first stored charge when the control terminal is in the first state, the second clamping component having the second stored charge when the control terminal is in the second state, the second clamping component having the third stored charge when the control terminal is in the third state.

2. The device of claim 1, wherein:
   the first voltage swing path comprises a first plurality of power switches coupled to a positive voltage source and a common terminal, the common terminal outputting the output signal;
   the first clamping component comprises an anode and a cathode, the anode of the first clamping component coupled to an input signal, the cathode of the first clamping component coupled to the first plurality of power switches;
   the second voltage swing path comprises a second plurality of power switches coupled to a negative voltage source and the common terminal; and
   the second clamping component comprises an anode and a cathode, the cathode of the second clamping component coupled to the input signal, the anode of the second clamping component coupled to the second plurality of power switches.

3. The device of claim 2, wherein the first clamping component and the second clamping component are diodes that have a low anode efficiency when the control terminals are in the first state and have a high anode efficiency when the control terminals are in the second state.

4. The device of claim 3, wherein the diodes include a buried n-doped layer throughout the diodes in a lateral direction between the anode and the cathode.

5. The device of claim 3, wherein the diodes are metal-oxide-semiconductor (MOS) gated diodes.

6. The device of claim 1, wherein the first clamping component and the second clamping component are reverse conducting insulated-gate bipolar transistors with diode control (RCDC IGBTs).

7. The device of claim 1, wherein the first clamping component and the second clamping component are coupled to a controller, the controller configured to:
   measure the output signal; and
   switch the control terminals of the first clamping component and the second clamping component to the first state in response to the output signal falling below a predetermined threshold.

8. The device of claim 7, wherein the controller is further configured to:
   switch the control terminals of the first clamping component and the second clamping component to the second state in response to the output signal rising above the predetermined threshold.

9. The device of claim 7, wherein the controller is further configured to:
   switch the control terminal of the first clamping component to the third state;
   switch the control terminal of the first clamping component to the second state after a time period elapses; and
   activate the first voltage swing path.

10. A system comprising:
    a neutral point clamped (NPC) inverter comprising a plurality of clamping devices, each of the plurality of clamping devices having a control terminal, each of the plurality of clamping devices having a first stored charge when the control terminal is in a first state and a second stored charge when the control terminal is in a second state, the first stored charge being greater than the second stored charge, the NPC inverter producing an AC output signal from a DC input signal;

a detector configured to measure the AC output signal of the NPC inverter; and a controller coupled to the detector and the NPC inverter, the controller configured to switch the control terminal of each of the plurality of clamping devices to the first state when the AC output signal measured by the detector falls below a predetermined threshold.

11. The system of claim 10, wherein the plurality of clamping devices comprise insulated-gate bipolar transistors (IGBTs) in parallel with controllable diodes, the IGBTs and controllable diodes being in voltage swing paths of the NPC inverter.

12. The system of claim 10, wherein the plurality of clamping devices are diodes that have a low anode efficiency in the first state and a high anode efficiency in the second state.

13. The system of claim 12, wherein the diodes include a controllable active semiconductor area, and wherein a first size of the controllable active semiconductor area in the first state is greater than a second size of the controllable active semiconductor area in the second state.

14. The system of claim 12, wherein the diodes include buried n-doped layers throughout the diodes in a lateral direction between anodes and cathodes of the diodes.

15. The system of claim 12, wherein the diodes are MOS gated diodes.

16. The system of claim 10, wherein the plurality of clamping devices are reverse conducting insulated-gate bipolar transistors with diode control (RCDC IGBTs).

17. The system of claim 10, wherein the controller is further configured to:
switch the control terminal of each of the plurality of clamping devices to the second state when the AC output signal measured by the detector rises above a predetermined threshold.

18. The system of claim 10, wherein each of the plurality of clamping devices have a third stored charge when the control terminal is in a third state, the third stored charge being less than the second stored charge.

19. The system of claim 18, wherein the controller is further configured to:
switch the control terminal of a first clamping device of the plurality of clamping devices to the third state;
switch the control terminal of the first clamping device to the second state after a time period elapses; and
activate a path of the NPC inverter coupled to an anode and a cathode of the first clamping device.

20. The system of claim 19, wherein the path of the NPC inverter is activated between 100 ns and 2 μs after the control terminal of the first clamping device is switched to the second state.

21. The system of claim 19, wherein the time period is between 1 ms and 10 ms, and a blocking voltage of the clamping devices is less than 2000 V.

22. The system of claim 19, wherein the time period is between 20 ms and 100 ms, and a blocking voltage of the clamping devices is 6.5 kV.

23. The system of claim 10, wherein the DC input signal is sourced from a solar panel.

24. The system of claim 10, wherein the DC input signal is sourced from a wind turbine.

25. The system of claim 10, wherein the AC output signal is transmitted to an electricity grid.

26. A method comprising:
configuring a clamping device in an inverter to operate in a first mode, the inverter producing an output signal equal to a first voltage in the first mode;
switching the clamping device to a second mode;
waiting a time period;
switching the clamping device back to the first mode;
after switching the clamping device back to the first mode, enabling a branch of the inverter coupled to the clamping device;
measuring the output signal; and
switching the clamping device to operate in a third mode in response to the measured output signal being a second voltage less than the first voltage.

\* \* \* \* \*